(12) United States Patent
Martin

(10) Patent No.: US 8,390,485 B2
(45) Date of Patent: Mar. 5, 2013

(54) SUBSET TRANSFORM INTERLEAVER

(75) Inventor: Timothy J. Martin, Carlsbad, CA (US)

(73) Assignee: Viasat, Inc., Carlsbad, CA (US)

( * ) Notice: Subject to any disclaimer, the term of this patent is extended or adjusted under 35 U.S.C. 154(b) by 126 days.

(21) Appl. No.: 13/052,880

(22) Filed: Mar. 21, 2011

(65) Prior Publication Data

US 2012/0242518 A1 Sep. 27, 2012

(51) Int. Cl.
*H03M 7/00* (2006.01)
(52) U.S. Cl. ............................................. 341/81; 341/51
(58) Field of Classification Search .................. 341/50, 341/51.87, 106; 714/759, 790, 728
See application file for complete search history.

(56) References Cited

U.S. PATENT DOCUMENTS

| | | | |
|---|---|---|---|
| 6,965,557 B2 * | 11/2005 | Kim | 370/209 |
| 7,000,099 B2 * | 2/2006 | Sazegari | 712/300 |
| 2007/0220377 A1 * | 9/2007 | Park et al. | 714/701 |
| 2007/0234180 A1 * | 10/2007 | Edmonston et al. | 714/759 |
| 2008/0233966 A1 * | 9/2008 | Scheim et al. | 455/452.1 |

OTHER PUBLICATIONS

S. Dolinar and D. Divsalar, "Weight Distribution for Turbo codes Using Random and Nonrandom Permutations," JPL Progress report 42-122, pp. 56-65, Aug. 15, 1995.
S. Crozier and P. Guinand, "High-Performance Low-Memory Interleaver Banks for Turbo-Codes", Proceedings of the 54th IEEE Vehicular Technology Conference (VTC 2001 Fall), Atlantic City, New Jersey, USA, pp. 2394-2398, Oct. 7-11, 2001.
J. Sun and O. Y. Takeshita, "Interleavers for turbo codes using permutation polynomials over integer rings," *IEEE Trans. on Inform. Theory*, vol. 51, No. 1, pp. 101-119, Jan. 2005.
M. Cheng, B. Moision, J. Hamkins, and M. Nakashima, "Efficient Algorithmic Interleaver for Turbo Decoder: Permutations are Computed When Needed, Rather Than Stored in Lookup Tables." Tech Briefs, www.techbriefs.com/component/content/article/6576 , Jan. 1, 2010.
"Turbo Code", Wikipedia, the free encyclopedia, http://en.wikipedia.org/wiki/Turbo_Code, accessed Jul. 23, 2010.
"Linear Congruential Generator", Wikipedia, the free encyclopedia, http://en.wikipedia.org/wiki/Linear_congruential_generator, accessed Nov. 17, 2010.

* cited by examiner

*Primary Examiner* — Peguy Jean Pierre
(74) *Attorney, Agent, or Firm* — Knobbe Martens Olson & Bear LLP

(57) ABSTRACT

Digital communications interleavers re-order the bits of a data coding block in a way that can be described by a table of indices that map the original order to the interleaved order. Conventional interleavers include index table interleavers, which store an index table ahead of operation and algorithmic Interleavers, which generate the indices during operation. Described herein are a new class of interleavers: Subset Transform Interleavers. A subset of generator outputs is selected and processed to create the interleaver indices. The selection is determined apriori and the selection results are stored in a Subset Usage Table. During operation, the generator is operated again and the Subset Usage Table entries determine which generator outputs are used. The generator may be a pseudo-random number generator. Implementations can use an Indexes Remaining Table, which can additionally be manipulated during operation such that it returns to an initialized state after each block interleaving process.

18 Claims, 15 Drawing Sheets

| Sequence of Random Numbers | Sequence of Scale Factors | Sequence of Scaled Random Numbers | Sequence of Bits from Memory | Selected List Pointer | Output of Index Value |
|---|---|---|---|---|---|
| 3006478341 | 10 | 7 | 1 | 7 | 7 |
| 1357883453 | 9 | 2 | 0 | | |
| 324325882 | 9 | 0 | 0 | | |
| 1909714348 | 9 | 4 | 1 | 4 | 4 |
| 536871751 | 8 | 1 | 1 | 1 | 1 |
| 2454351025 | 7 | 4 | 1 | 4 | 8 |
| 135753 | 6 | 0 | 0 | | |
| 3579151758 | 6 | 5 | 1 | 5 | 5 |
| 1717993707 | 5 | 2 | 1 | 2 | 2 |
| 1073744147 | 4 | 1 | 1 | 1 | 9 |
| 2863360114 | 3 | 2 | 1 | 2 | 6 |
| 859692340 | 2 | 0 | 0 | | |
| 777823942 | 2 | 0 | 0 | | |
| 2147483648 | 2 | 1 | 1 | 1 | 3 |
| 84323523 | 1 | 0 | 1 | 0 | 0 |

FIG. 6

| List Index | Initial Value | 1 | 2 | 3 | 4 | 5 | 6 | 7 | 8 | 9 | 10 |
|---|---|---|---|---|---|---|---|---|---|---|---|
| 0 | 0 | 0 | 0 | 0 | 0 | 0 | 0 | 0 | 0 | 0 | 0 |
| 1 | 1 | 1 | 1 | 9 | 9 | 9 | 9 | 3 | 3 | 1 | 1 |
| 2 | 2 | 2 | 2 | 2 | 2 | 2 | 6 | 6 | 2 | 2 | 2 |
| 3 | 3 | 3 | 3 | 3 | 3 | 3 | 3 | 3 | 3 | 3 | 3 |
| 4 | 4 | 4 | 8 | 8 | 6 | 6 | 4 | 4 | 4 | 4 | 4 |
| 5 | 5 | 5 | 5 | 5 | 5 | 5 | 5 | 5 | 5 | 5 | 5 |
| 6 | 6 | 6 | 6 | 6 | 6 | 6 | 6 | 6 | 6 | 6 | 6 |
| 7 | 7 | 9 | 9 | 7 | 7 | 7 | 7 | 7 | 7 | 7 | 7 |
| 8 | 8 | 8 | 8 | 8 | 8 | 8 | 8 | 8 | 8 | 8 | 8 |
| 9 | 9 | 9 | 9 | 9 | 9 | 9 | 9 | 9 | 9 | 9 | 9 |
| Scale Factor | 10 | 9 | 8 | 7 | 6 | 5 | 4 | 3 | 2 | 1 | |

FIG. 7

| Original Position | Interleaved Position |
|---|---|
| 0 | 7 |
| 1 | 4 |
| 2 | 1 |
| 3 | 8 |
| 4 | 5 |
| 5 | 2 |
| 6 | 9 |
| 7 | 6 |
| 8 | 3 |
| 9 | 0 |

SUBSET TRANSFORM INTERLEAVER

BACKGROUND

1. Field

The present technology relates to interleavers. More particularly, the technology relates to an interleaver with a low memory footprint suitable for use in digital communication systems.

2. Description of the Related Art

In digital communications, interleaving is used as a component in iterative forward error correction (FEC) coding algorithms. Interleavers are used to re-order the bits of a data block to help increase the performance of such FEC coding algorithms. Generally, an interleaver maps a bit or symbol position of an input data block to another bit or symbol position in an output data block. Conventional interleavers used in such FEC coding algorithms include pseudo-random interleavers and algorithmic (structured) interleavers.

Conventionally, pseudo-random interleavers are generated using a pseudo-random number generator under certain constraints. One example of such a pseudo-random interleaver is an "S-random" interleaver as described in the publication by S. Dolinar and D. Divsalar, "Weight Distribution for Turbo Codes Using Random and Nonrandom Permutations," JPL Progress Report 42-122, pp. 56-65, Aug. 15, 1995. In an S-random interleaver, "S" may be any positive integer value. A pseudo-random number generator is used to generate numbers to be selected or discarded as indexes for the interleaver sequence of length K, where K is a positive integer corresponding to the length of the blocks being re-ordered. Each generated number is either selected as the next index for the interleaver sequence, or discarded until K integers are selected. Each generated number is compared to the previous S values (or fewer if there are not S previous values) selected as part of the interleaver sequence. If the generated number has a value that is within +/−S of any of the previous S indexes selected in the interleaver sequence, the generated number is discarded. Otherwise, the generated number is selected as the next index for the interleaver sequence.

The search time for selecting a number as the next index for the interleaver sequence increases as the value of S increases. Further, there is no guarantee that the pseudo-random number generator will generate numbers for the interleaver sequence that satisfy the S constraint. Accordingly, generation of such interleaver sequences for S-random interleavers and similar pseudo-random interleavers is time consuming and therefore is not performed on the fly during data encoding/decoding. Thus, once an interleaver sequence is successfully generated, the interleaver sequence is stored in a lookup-table based architecture for use during data encoding/decoding. FIG. 1A is a flowchart illustrating a process of generating such a lookup table for a pseudo-random interleaver. As shown, index values are generated, and if they meet the criteria for an interleaver (e.g., satisfy the S constraint), the index values are stored. An interleaver using such a lookup-table arranges data according to the stored sequence. FIG. 1B is a flowchart illustrating a process of operating a pseudo-random interleaver that uses values stored in a lookup table. As shown, bits are moved based on the index values contained in the lookup table. These lookup tables require large amounts of storage in memory to store each individual index of the pseudo-random interleaver. However, pseudo-random interleavers provide good performance levels and construction is of relatively low complexity.

Conventional algorithmic interleavers are defined by a generation algorithm and a set of algorithm parameters. Such algorithms are capable of being run in real time. Further, such algorithms and parameters require less storage in memory than the lookup table of a pseudo-random interleaver. An interleaver using such algorithms arranges data according to the sequence of algorithm outputs. FIG. 1C is a flowchart illustrating a process of operating an algorithmic interleaver. As shown, bits are moved based on the index location generated by an algorithm. Examples of algorithmic interleavers are dithered relative prime interleavers and quadratic permutation polynomial interleavers. Although algorithmic interleavers provide memory efficiencies that may be useful for high volume communication equipment manufacturers (e.g., mobile phone manufacturers), the interleaver sequences they produce generally perform poorer as compared to S-random interleavers.

SUMMARY

The systems, methods, and devices described herein each may have several aspects, no single one of which is solely responsible for its desirable attributes. Without limiting the scope of this disclosure as expressed by the claims which follow, its more prominent features will now be discussed briefly. After considering this discussion, and particularly after reading the section entitled "Detailed Description" one will understand how the features of this technology provide advantages that include memory efficient, low complexity interleavers.

One aspect of this disclosure is an interleaver index generator. The interleaver index generator includes a number generator having an output comprising a series of numerical values. The interleaver index generator includes a memory storing data defining a set of said series of numerical values to use in generating interleaver indexes. The interleaver index generator includes processor circuitry receiving said set of numerical values and processing each of said set of numerical values to generate a corresponding set of interleaver indexes.

Another aspect of this disclosure is a method of generating interleaver indexes on the fly during data encoding/decoding. The method includes, during encoding or decoding, generating a series of numerical values. The method includes, during encoding or decoding, selecting a subset of said numerical values. The method includes, during encoding or decoding, deriving a series of interleaver indexes from said selected subset of numerical values.

Another aspect of this disclosure is an interleaver index generator. The interleaver index generator includes means for outputting a series of numerical values. The interleaver index generator includes means for storing data defining a set of said series of numerical values to use in generating interleaver indexes. The interleaver index generator includes means for receiving said set of numerical values and processing each one of said set of numerical values to generate a corresponding set of interleaver indexes.

Another aspect of this disclosure is a non-transitory computer-readable medium, comprising instructions that when executed perform a method of generating interleaver indexes on the fly during data encoding/decoding. The method includes, during encoding or decoding, generating a series of numerical values. The method includes, during encoding or decoding, selecting a subset of said numerical values. The method includes, during encoding or decoding, deriving a series of interleaver indexes from said selected subset of numerical values.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are not to be considered limiting of its scope, the disclosure will be described with additional specificity and detail through use of the accompanying drawings.

FIG. 6 is a table that represents an example of certain values generated when executing the interleaver sequence generator of FIG. 4.

FIG. 7 is a table that represents an example of the values of a list maintained by the list processor when executing the interleaver sequence generator of FIG. 4 using the values shown in FIG. 6.

DETAILED DESCRIPTION

The following detailed description is directed to certain specific embodiments. However, the teachings herein can be applied in a multitude of different ways, including for example, as defined and covered by the claims. It should be apparent that the aspects herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, a system or apparatus may be implemented or a method may be practiced using any number of the aspects set forth herein. In addition, such a system or apparatus may be implemented or such a method may be practiced using other structure, functionality, or structure and functionality in addition to or other than one or more of the aspects set forth herein. In this description, reference is made to the drawings wherein like parts are designated with like numerals throughout.

Various embodiments of systems and methods are described herein for generating and using memory efficient, low-complexity interleavers. Such interleavers may be used in various applications including in digital communication and storage systems. For example, such interleavers may be used to improve the performance of forward error correcting (FEC) coding algorithms. Such interleavers may be used for both the encoding and decoding side of digital communication systems that use such FEC coding algorithms. Such interleavers provide benefits over conventional interleavers including a low design complexity combined with a low memory requirement.

The interleavers discussed below may be implemented, for example, in a field programmable gate array (FPGA), application specific integrated circuit (ASIC), or other suitable hardware and/or software. The techniques described below are described with respect to interleavers, though the techniques may also be utilized for deinterleavers.

Figure 1A:
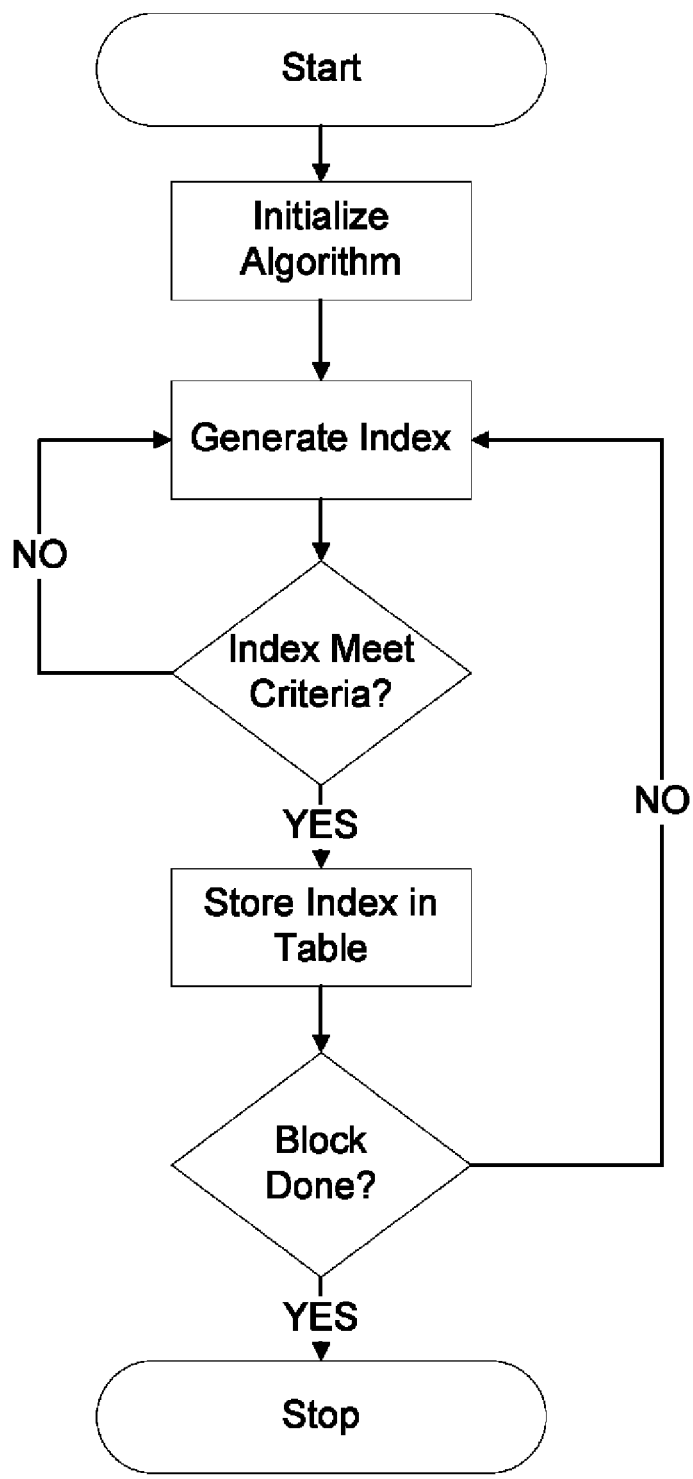
FIG. 1A is a flowchart illustrating a process of generating a lookup table for a pseudo-random interleaver.
Figure 1B:
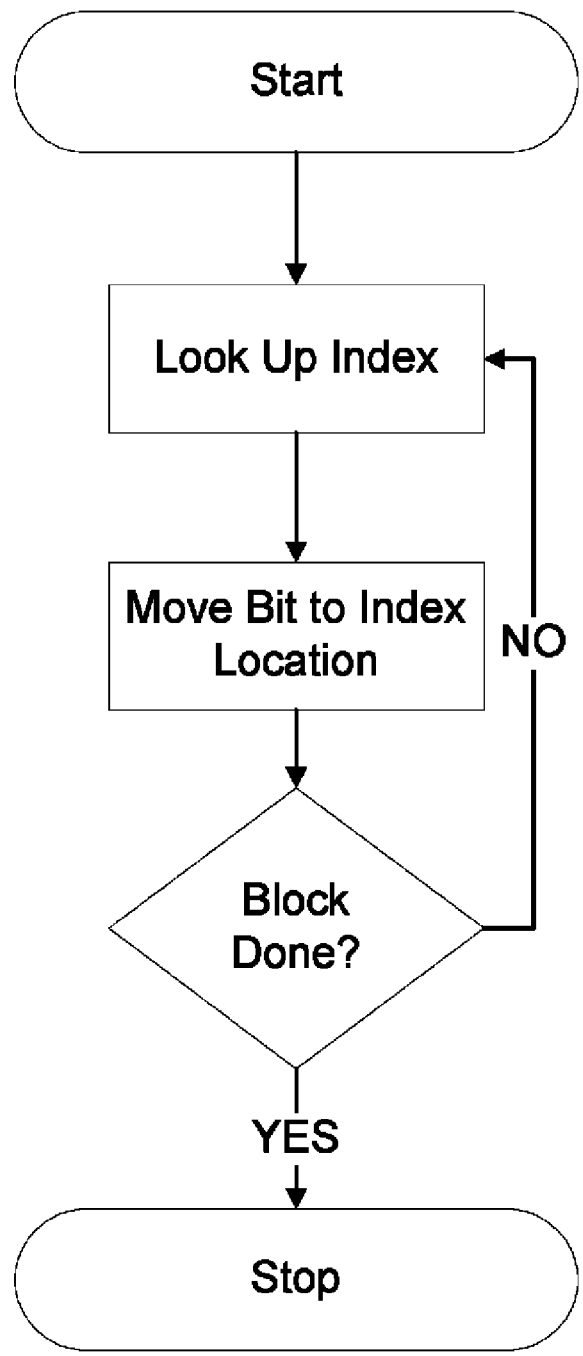
FIG. 1B is a flowchart illustrating a process of operating a pseudo-random interleaver that uses values stored in a lookup table.
Figure 1C:
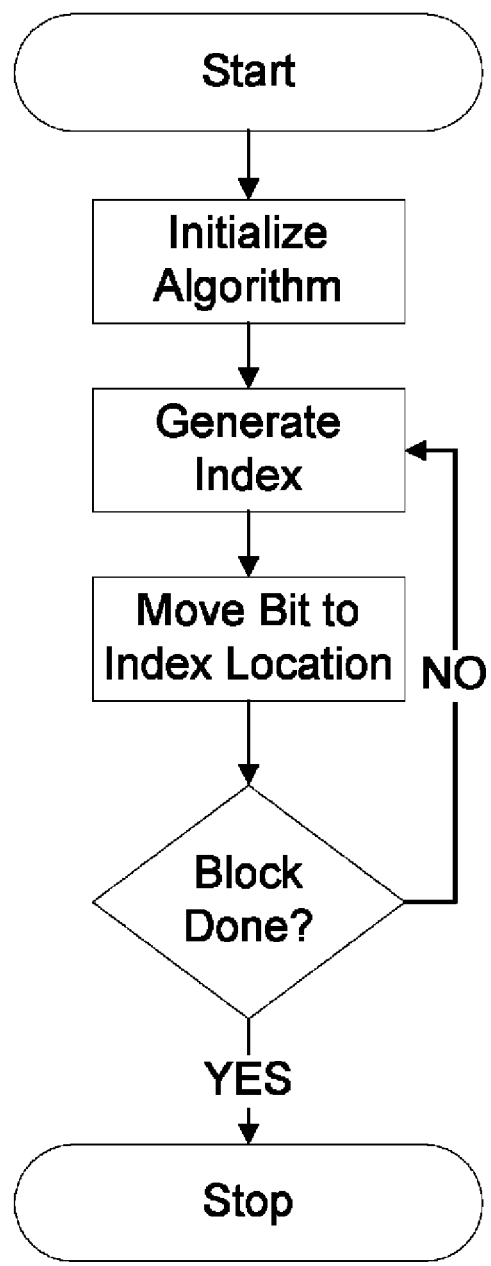
FIG. 1C is a flowchart illustrating a process of operating an algorithmic interleaver.
Figures 1D, 1E:
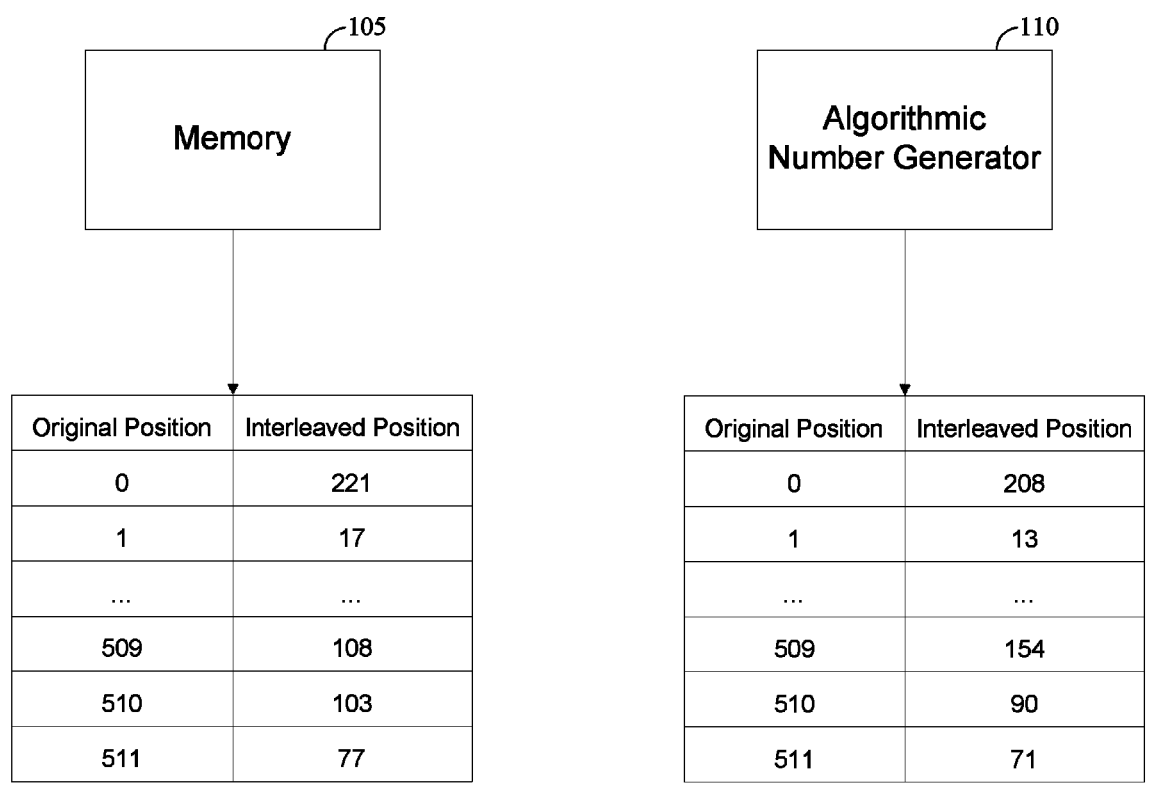
FIG. 1D illustrates a conventional pseudo-random interleaver including a memory that stores indexes for the interleaver.
FIG. 1E illustrates a conventional algorithmic interleaver including an algorithmic number generator.

FIG. 1D depicts a conventional pseudo-random interleaver including a memory 105 that stores indexes for the interleaver. As shown in FIG. 1D, the memory 105 stores 512 indexes, each index requiring 9-bits for storage. Accordingly, the memory 105 is required to store 4608 bits to store the indexes required for the interleaver. The indexes are pre-generated as described above by utilizing a pseudo-random number generator to generate numbers, and selecting or discarding the generated numbers, wherein the selected values form the indexes. The indexes may correspond to an S-random interleaver, which provides good performance for data communication.

FIG. 1E depicts a conventional algorithmic interleaver including an algorithmic number generator 110. The algorithmic number generator generates indexes based on a stored algorithm. Though less memory is required to store an algorithm than is needed to store indexes such as for the conventional pseudo-random interleaver of FIG. 1D, the generated indexes may not perform as well as those stored according to a conventional pseudo-random interleaver. Further, it can be costly and time consuming to find an algorithm that generates appropriate indexes.

The problems with these interleavers are compounded for communication systems that can use multiple block sizes and encoding schemes, because a different interleaver is used for each one. This increases the memory required for the index generator in FIG. 1A and increases the number of required algorithms in the index generator of FIG. 1D.

Figure 2A:
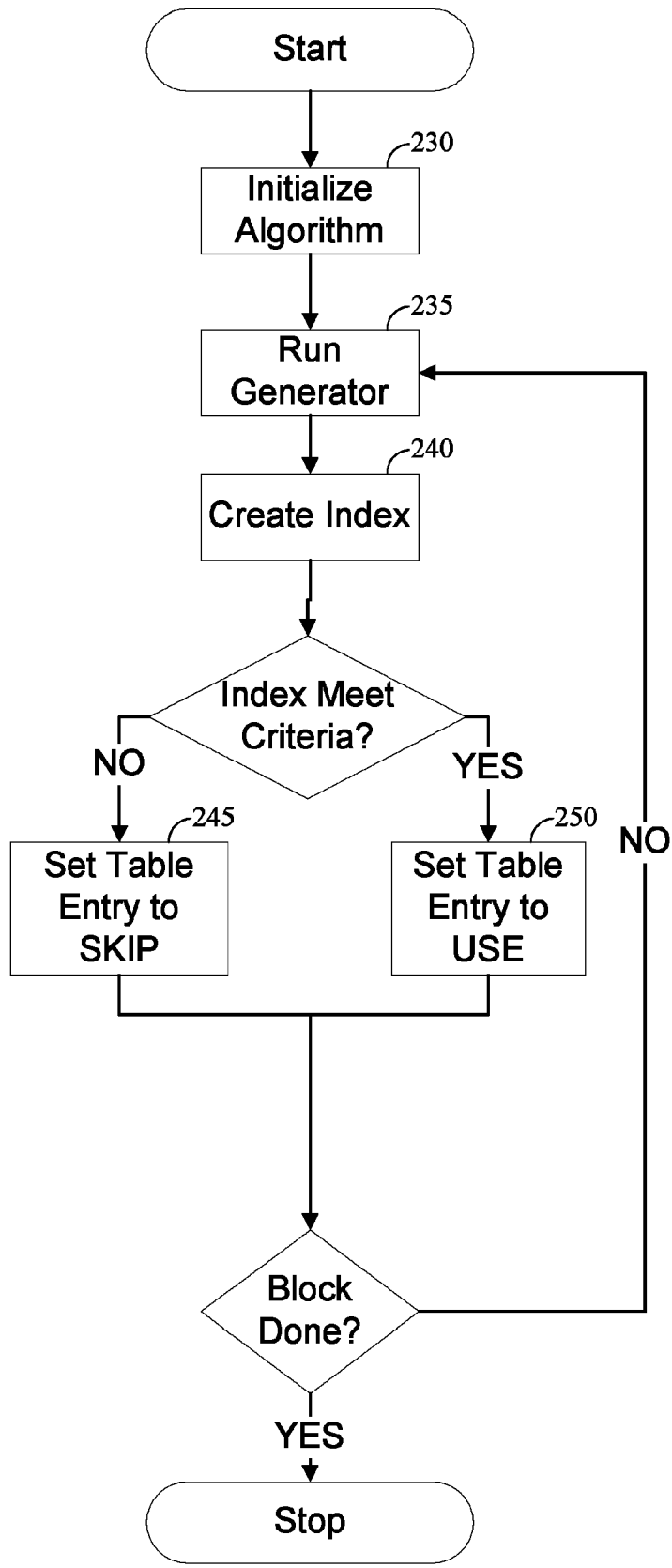
FIG. 2A is a flowchart illustrating a process of generating a memory efficient, low complexity interleaver sequence generator.

The techniques described herein combine the memory efficiencies of algorithmic interleavers with the performance of pseudo-random interleavers in a novel manner to provide high-performance, low memory requirement interleavers. In particular, instead of storing each index of an interleaver, such as in an S-random interleaver, the techniques described herein require only a single bit value be stored for each generated number, selected or not, generated by a number generator. The single bit value indicates whether each number generated is processed to become an index or not. Thus, utilizing the stored single bit values and the numbers generated, the indexes can be generated without storing the actual indexes. FIG. 2A is a flowchart illustrating a process of generating a memory efficient, low complexity interleaver sequence generator. As shown, a number generator is initialized at block 230. The generator is run at block 235. Potential index values are generated at block 240. If the potential index value meets a given criteria, a bit is stored in a table that indicates the index value should be used at block 250. If the potential index value does not meet the given criteria, a bit is stored in a table that indicates the index value should not be used at block 245.

Though there may be a greater number of generated numbers as compared to indexes, an index may take a very large number of bits to store. For example, where there are 4 times as many generated numbers as indexes, approximately 4-bits are needed to indicate whether generated numbers are selected or not for each generated number that is actually selected. Therefore, for an interleaver with 512 indexes, 2048 bits may be needed to store the information to generate an interleaver. In comparison, the actual indexes, as discussed above, require 4608 bits to store. Thus, overall the techniques herein require less memory storage as compared to a similar pseudo-random interleaver with a look up table storing each index.

The memory requirements may further be reduced by selecting an appropriate number generator to generate numbers from which indexes are selected. For example, a number generator may be seeded with different values or different number generators may be selected, such that different sequences of numbers are generated. Sequences that require fewer generated numbers per index selected reduce the overall numbers of bits needed to indicate whether generated numbers are selected or not for each generated number that is actually selected.

The memory savings are even more apparent as discussed with respect to an interleaver associated with a modulator in a communication system that utilizes multiple interleavers as part of communicating data between devices. For example, a modulator may be configured to modulate data using 8 different modulation and coding points and 6 different code block sizes, leading to 48 unique modulation configurations. Further, each codeblock may have a size of up to 65535 bits in length. Each modulation configuration may require a different interleaver. Storing all of the indexes for 48 different interleavers may require several Mbits of memory, since each index may require approximately 16-bits to store the value due to the size of the codeblocks. Storing the single bit values for each generated number, however, may require a few hundred kbits of memory. Therefore, techniques described herein may be implemented with less memory, which may allow, for example, a single-chip hardware implantation, such as in a low cost FPGA.

Figure 2B:
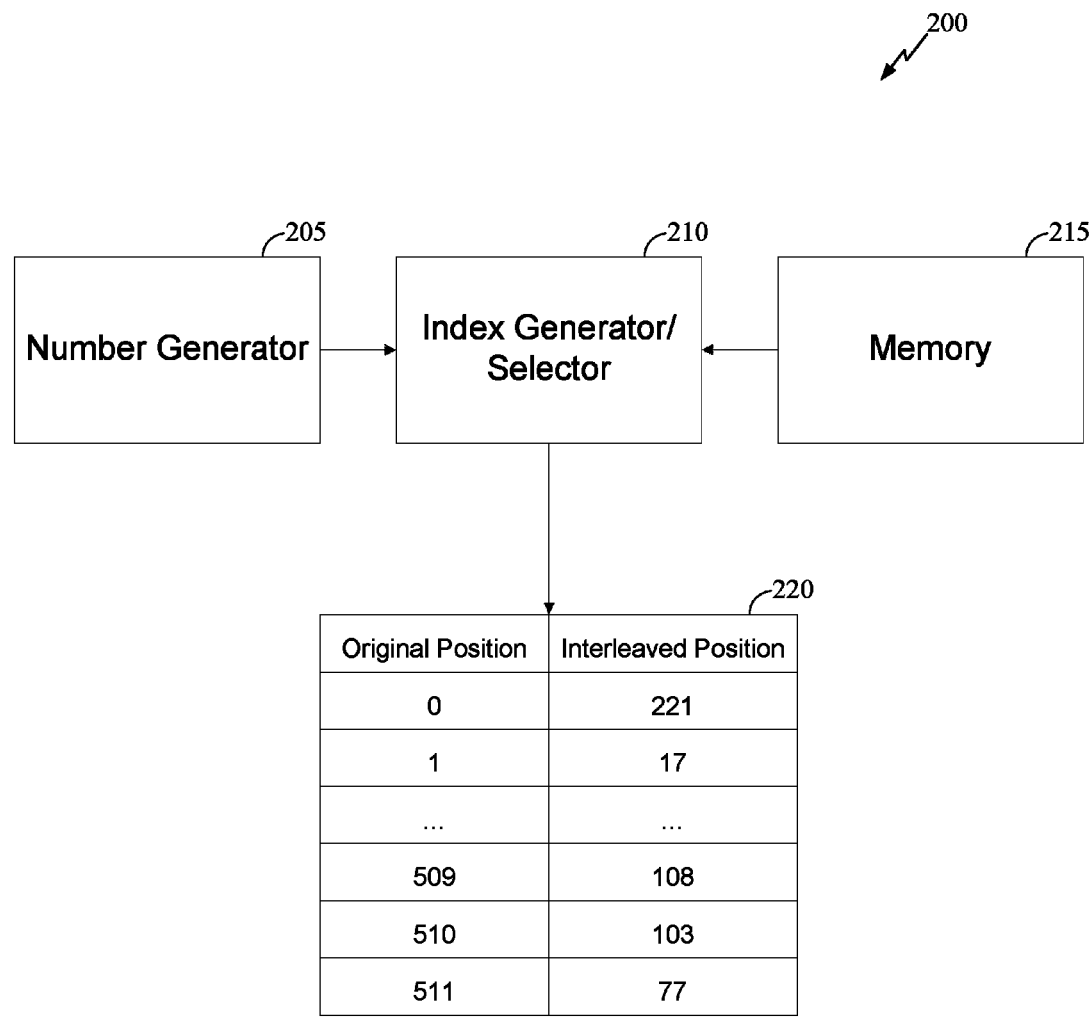
FIG. 2B is a block diagram illustrating a memory efficient, low complexity interleaver sequence generator.

FIG. 2B is a block diagram illustrating a memory efficient, low complexity interleaver sequence generator 200 designed according to these principles. The interleaver sequence generator is configured to generate an interleaver sequence according to the process 300 shown in FIG. 3. The interleaver sequence generator 200 includes a number generator 205. The numbers generated by the number generator 205 can be a sequence of numbers. Each time the number generator 205 is run with the same constraints (e.g., seeded with the same values), the same sequence of numbers is produced. This sequence of numbers can be used to produce a set of indexes for an interleaver sequence. For example, at a step 305, the number generator 205 is initialized. Further, at a step 310, the number generator 205 generates a number. Following generation of each number at the step 310, it is then determined, at a step 315, whether to use the generated number to produce an index in the interleaver sequence or, alternatively, discard the number. The determination to select or discard may be performed by an index generator and selector 210 coupled to the number generator 205 and memory 215. If the generated number is not to be selected, the interleaver sequence generator 200 returns to the step 310 and generates another number. If the number is selected, it is used to produce the next index for the interleaver sequence at a step 320. Continuing at a step 325, the bits of data to be interleaved are moved to the location indicated by the index value selected at step 320. If all the bit values have been interleaved, as determined at a step 330, the process ends. If all the bit values have not been interleaved, the interleaver sequence generator 200 then returns to the step 310 and generates another number. In one embodiment, the index generator and selector 210 produces index values to generate an interleaver sequence satisfying an S-random constraint. The number generator 205 of FIG. 2B may directly generate index values, e.g. for a 512 bit block, it may output values from 0-511. In this case, the index generator/selector could simply either discard the output value, or output it as the next interleaver index. In other embodiments, such as the specific implementation described below, non-discarded outputs of the number generator are not used directly as index values, but are used to generate or select other numbers that are the actual index values.

The memory 215, coupled to the index generator and selector 210, stores a sequence of bits, wherein each bit of the sequence of bits is associated with one output of the number generator 205. Each bit indicates whether the associated number is selected to generate an index of the interleaver sequence or is discarded. For example, a value of '1' for a bit may indicate the associated number is to be selected, and a value of '0' may indicate the associated number is to be discarded. This bit sequence is generated during interleaver design by setting bits to one that result in the desired output index values. Accordingly, the sequence of bits stored in the memory 215 combined with the sequence of values generated by the number generator 205 define an interleaver sequence. For example, as show in FIG. 2B, an interleaver sequence 220 with the same indexes that provide good performance as the conventional S-random interleaver shown in FIG. 1D can be generated with a lower memory requirement for storage of the data necessary to generate the interleaver than the S-random interleaver shown in FIG. 1D.

Figure 4:
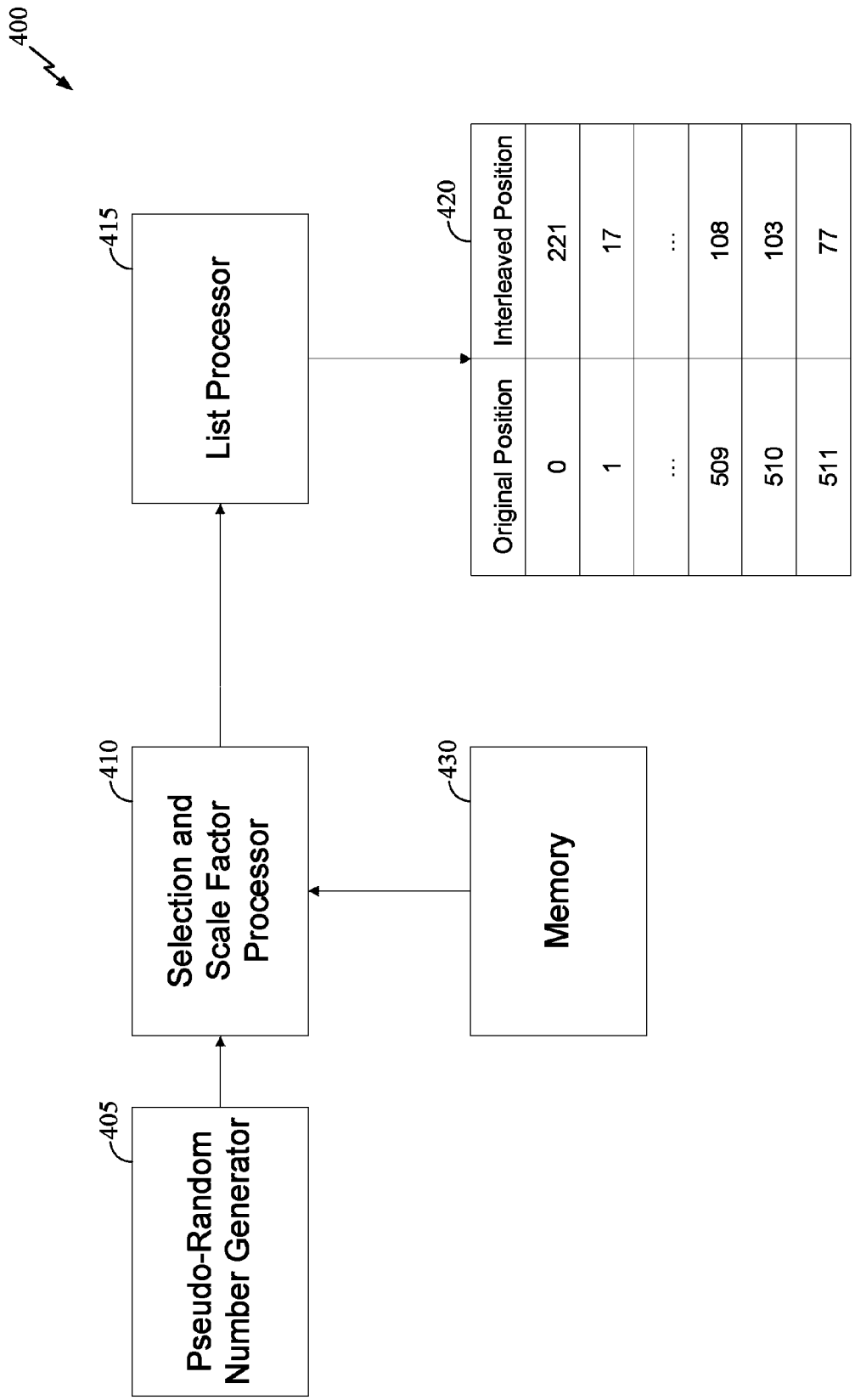
FIG. 4 is a block diagram illustrating another memory efficient, low complexity interleaver sequence generator.
Figure 5:
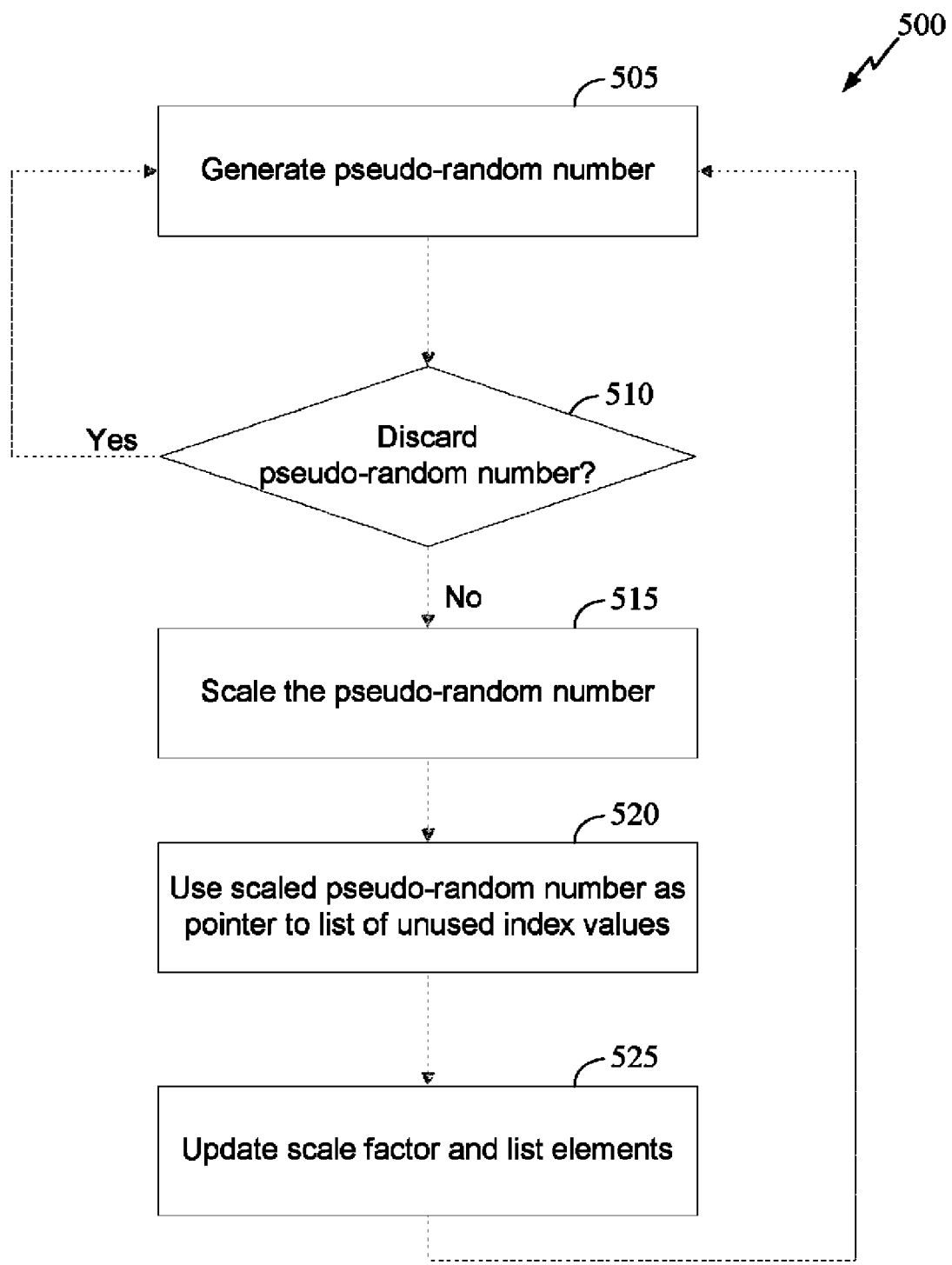
FIG. 5 is a flowchart illustrating a process of operating the interleaver sequence generator of FIG. 4.

FIG. 4 is a block diagram illustrating memory efficient, low complexity interleaver sequence generator 400. The interleaver sequence generator 400 is one possible implementation of the interleaver sequence generator 200 of FIG. 2B and can be used to generate indexes for an interleaver sequence according to the process 500 shown in FIG. 5. The interleaver sequence generator 400 includes a pseudo-random number generator 405. Any suitable pseudo-random number generator may be used as is known in the art. For example, the pseudo-random number generator may be a low complexity pseudo-random number generator, such as a linear congruential random number generator.

At a first step 505, the pseudo-random number generator 405 generates a pseudo-random number. In one embodiment, pseudo-random number generator 405 is configured to output values x in sequence, where x is between 0 and RAND_MAX, inclusive.

Continuing at a step 510, the interleaver sequence generator 400 selects or discards generated values x, where only selected values of x are used to generate indexes for an interleaver sequence. For example, values x are selected, or not discarded, similar to the process discussed above with respect to FIGS. 2B and 3. The pseudo-random number generator 405 is further coupled to a selection and scale factor processor 410, which selects and discards values x. The selection and scale factor processor 410 is further coupled to a memory 430 similar to the memory 215 discussed above. The memory 430 similarly stores a sequence of bits, wherein each bit of the sequence of bits is associated with one output of the pseudo-random number generator and is used to select and discard produced values x. This bit sequence is generated during interleaver design by setting bits to one that result in the desired output index values. Accordingly, the selection and scale factor processor 410 selects or discards generated values x according to the bit sequence stored in the memory 430. If the generated value x is discarded, the process returns to step 505 and generates the next pseudo-random number. If the generated value x is selected, the process continues to a step 515.

Further at the step 515, the interleaver sequence generator 400 scales the generated value x. The selection and scale factor processor 410 processes values produced by the pseudo-random number generator 405. The selection and scale factor processor 410 only processes those values x produced by the pseudo-random number generator 405 that are selected, or not discarded. The selection and scale factor processor 410 scales each produced value x that is selected according to equation 1 as follows to produce a corresponding scaled pseudo-random value y.

$$y=\mathrm{floor}[(Ax)/(\mathrm{RAND\_MAX}+1)] \quad (1)$$

In equation 1, "A" is a scale factor that is initially set to the length K of the interleaver sequence to be generated. After the scale factor A is used in equation 1 for a given value x, the scale factor A is later decremented by 1 as discussed below for use in the equation 1 for a new value x. This is performed so that selection of index positions from a list L, discussed below, is optimized to only select index positions not previously selected. Accordingly, each pseudo-random value y produced by the selection and scale factor processor 410 is between 0 and A−1. Pseudo-random values y, which are all based on values x that are not discarded, are used to generate index values as discussed below.

Continuing at a step 520, the interleaver sequence generator 400 uses the scaled pseudo-random number y as a pointer in a list L to select an unused index value for the interleaver sequence. For example, the generation of index values may be performed by a list processor 415 coupled to the selection and scale factor processor 410. The list processor 415 may maintain a list L with elements $L_i$, where i is an index position in the list L and i is a value from 0 to K−1. Initially, the value of each element $L_i$ is set to the index position i. The list processor 415 utilizes each generated pseudo-random value y to select the value z of the element $L_y$ from the list as the next index value.

Further, at a step 525, the interleaver sequence generator 400 updates the scale factor A and the values of the list elements of list L. For example, as each index value z is selected for the interleaver sequence, the value of element $L_y$ is changed to the value of element $L_{A-1}$, where A is the value used in equation 1 to generate the corresponding pseudo-random value y. Further, the value of element $L_{A-1}$ may be set to its initial value A−1. The value of A is then decremented by 1 as discussed above. Index values are selected until an interleaver sequence 420 of length K is generated.

The use of the list L as discussed above causes any generated pseudo-random number to be associated with a potential value that has not been previously selected as an index value. Therefore, generated pseudo-random numbers are not associated with index values that have already been selected and therefore have a higher likelihood of being selected as an index value, thus increasing the ratio of selected values to discarded values. Therefore, fewer bits are needed to indicate whether generated values are selected or not for each generated value that is actually selected.

One of ordinary skill in the art should recognize that various steps may be added, omitted, or changed from the processes 300 and 500. Further, the various steps of the processes 300 and 500 may be performed in a different order than described above.

Figure 8:
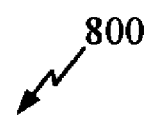
FIG. 8 is a table that represents an example of the generated interleaver sequence when executing the interleaver sequence generator of FIG. 4 using the values shown in FIG. 6.

Generation of an interleaver sequence through use of a number generator as discussed above is further discussed below with respect to a specific example. In this example, numbers are generated by a number generator and processed according to the techniques described above with respect to FIGS. 4 and 5. The example is representative both of 1) how a bit sequence that indicates whether generated values are selected or discarded is generated; and 2) how an interleaver sequence is selected from generated values. FIGS. 6-8 show the values of the variables discussed above as the techniques are performed.

FIG. 6 is a table that represents an example of certain values generated when executing the pseudo-random number generator 405 of FIG. 4. Each row of the table 600 represents the generation of a single output of the pseudo-random number generator 405. The first column, "Sequence of Random Numbers," represents the values of the pseudo-random numbers x generated by the pseudo-random number generator 405. The second column, "Sequence of Scale Factors," represents the values of the scale factor A set by the selection and scale factor processor 410. The third column, "Sequence of Scaled Random Numbers," represents the scaled pseudo-random numbers y generated by the selection and scale factor processor 410. The fourth column, "Sequence of Bits from Memory," represents the bit values of the sequence of bits stored in the memory 430. The fourth column, "Selected List Pointer," represents the value found for the list element $L_y$ by the list processor 415. The fifth column, "Output Index Value," represents the indexes z selected for the interleaver sequence.

FIG. 7 is a table that represents an example of the values of a list L maintained by the list processor 415 when executing the interleaver sequence generator 400 of FIG. 4 using the values shown in FIG. 6. Each row of the table 700, other than the final row, represents an index position i of the list L. The first column, "List Index," represents the number of the index position i of the list. The second column, "Initial Value," represents the initial value of the list element $L_i$ at each index position i. The remaining numbered columns each represent the value of the list element $L_i$ at each index position i after an index for the interleaver sequence has been selected and the list processor 415 updates the list L as discussed above. The final row represents the value of the scale factor A as each index is selected for the interleaver sequence.

As shown in FIGS. 6 and 7, in one example of generating an interleaver sequence using the interleaver sequence generator 400, the interleaver sequence generator 400 is initialized as follows. The length K of the interleaver sequence to be generated is set to 10. Accordingly, the scale factor A is initially set to 10 and the list L is initialized with the values 0 to 9. Further, in this example, RAND_MAX is $2^{32}-1$. The pseudo random number generator 405 generates an initial pseudo-random value x of 3006478341 as shown in the first row of table 600.

Further, the selection and scale factor processor 410, determines whether to discard or select the pseudo-random value x of 3006478341 to generate an index value for the interleaver sequence. The selection and scale factor processor 410 determines the value of the corresponding bit stored in the memory 430. As shown in the first row of table 600, the value is 1. Accordingly, the pseudo-random value x of 3006478341 is selected to generate an index value for the interleaver sequence.

Continuing, the selection and scale factor processor 410, using equation 1, with A=10, generates a scaled pseudo-random value y of 7 and communicates the pseudo-random value y of 7 to the list processor 415. The list processor 415 accesses the value $L_7$ stored at index 7 of list L to generate an index value for the interleaver sequence. The value stored at $L_7$ is initially 7, as shown in the "Initial Value" column of table 700. Accordingly, the first selected value for the interleaver sequence is 7, as shown in the first row of table 800.

Further, since a value was selected for the interleaver sequence based on the bit, associated with the first generated pseudo-random value and stored in the memory 430, being 1, the scale factor A and list L are updated as follows. The list processor 410 sets $L_7$ ($L_y$) to 9, which is the value of $L_9$ ($L_{A-1}$), and sets $L_9$ to 9, which is the value of A−1, as shown in column "1" of the table 700. Further, the selection and scale factor processor 410 decrements the value of A by 1, thus setting A=9.

The next pseudo-random value x generated by the pseudo random number generator 405 is 1357883453 as shown in the second row of the table 600. Further, the selection and scale factor processor 410 determines the value of the corresponding bit stored in the memory 430. As shown in the second row of the table 600, the value is 0. Accordingly, the selection and scale factor processor 410 discards the pseudo-random number 1357883453. The next generated pseudo random value x is 324325882, which is similarly discarded based on the corresponding bit value stored in the memory 430 being 0, as shown in the third row of table 600.

The next pseudo-random value x generated by the pseudo random number generator 405 is 1909714348 as shown in the fourth row of the table 600. Further, the selection and scale factor processor 410, determines the value of the corresponding bit stored in the memory 430, as shown in the fourth row of the table 600, is 1. Accordingly, the pseudo-random value x of 1909714348 is selected to generate an index value for the interleaver sequence.

Further, the selection scale factor processor 410, using equation 1, with A=9, generates a scaled pseudo-random value y of 4 and communicates the pseudo-random value y of 4 to the list processor 415. The list processor 415 accesses the value $L_4$ stored at index 4 of list L. The value stored at $L_4$ is 4, as shown in column "1" of table 700. Accordingly, the second selected value for the interleaver sequence is 4, as shown in the second row of the table 800.

Further, since a value was selected for the interleaver sequence based on the bit associated with the fourth generated pseudo-random value and stored in the memory 430, being 1, the scale factor A and list L are updated as follows. The list processor 410 sets $L_4$ ($L_y$) to 8, which is the value of $L_8$ ($L_{A-1}$), and sets $L_8$ to 8, which is the value of A−1, as shown in column "2" of the table 700. Further, the selection and scale factor processor 410 decrements the value of A by 1, thus setting A=8. The interleaver sequence generator 400 continues until the entire interleaver sequence is generated. The remainder of the example is shown in tables 600-800.

FIG. 8 is a table that represents an example of the generated interleaver sequence when executing the interleaver sequence generator 400 of FIG. 4 using the values shown in FIG. 6. Each row of the table 800 represents an index position of the interleaver sequence. The first column, "Original Position" represents the original position of data to be interleaved. The second column, "Interleaved Position," represents the position to arrange the data found at the given index position.

Figure 3:
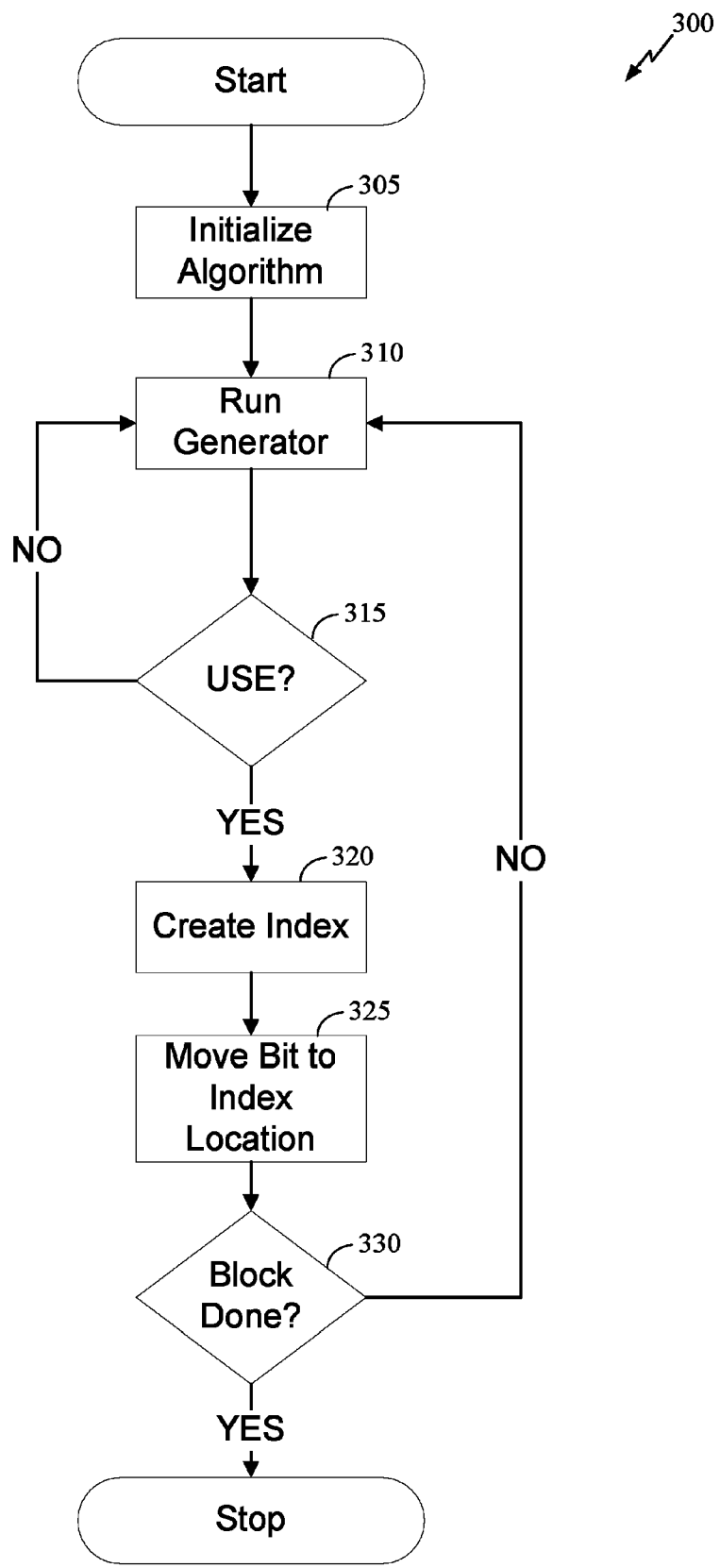
FIG. 3 is a flowchart illustrating a process of operating the interleaver sequence generator of FIG. 2B.
Figure 9:
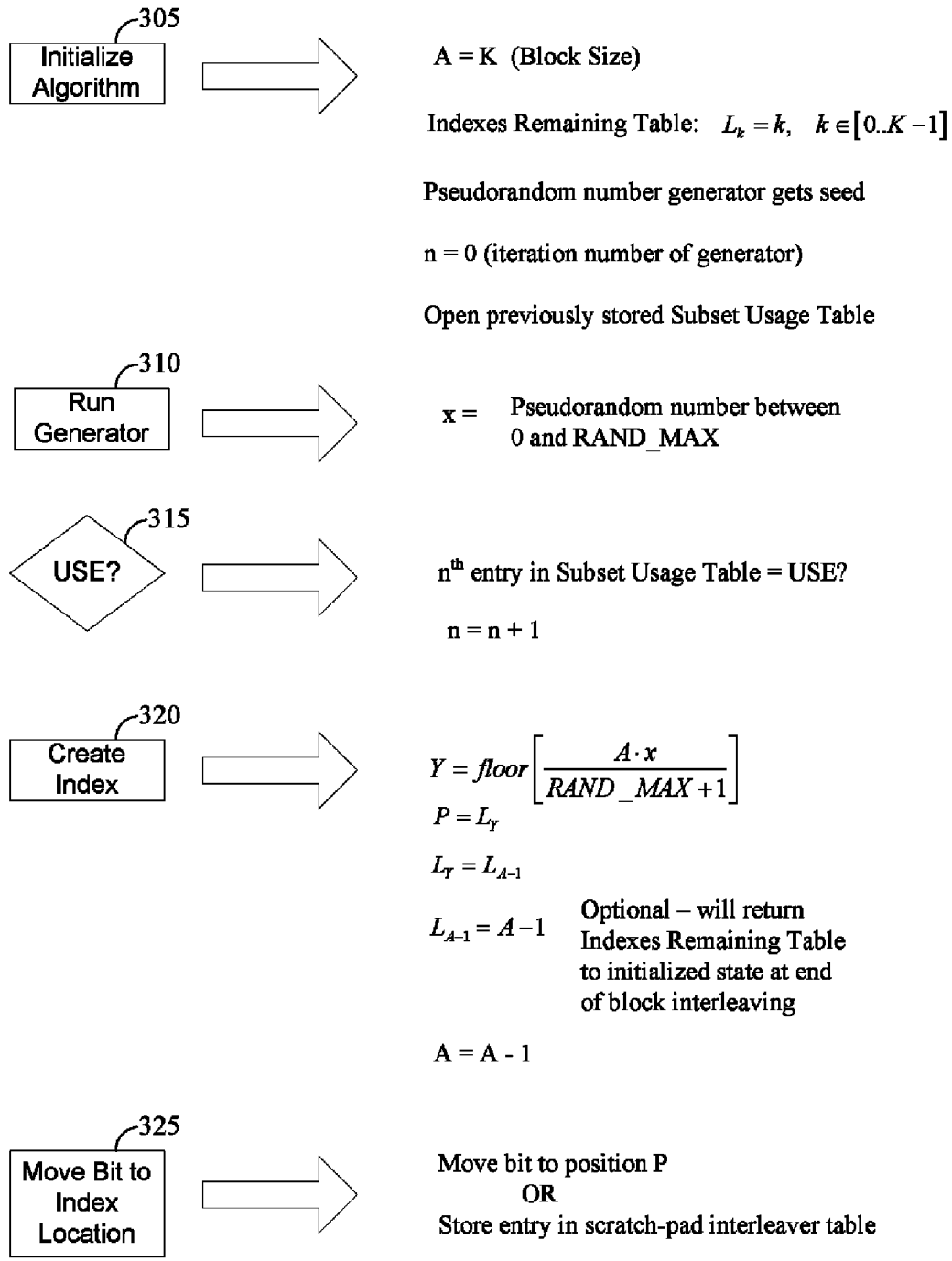
FIG. 9 illustrates one specific embodiment of the implementation of certain blocks shown in FIG. 3.

FIG. 9 illustrates one specific embodiment of the implementation of certain blocks shown in FIG. 3. As shown, the figure illustrates the variables and functions used at each block for operating an embodiment of the interleaver described with respect to FIGS. 2B and 3.

Figure 10:
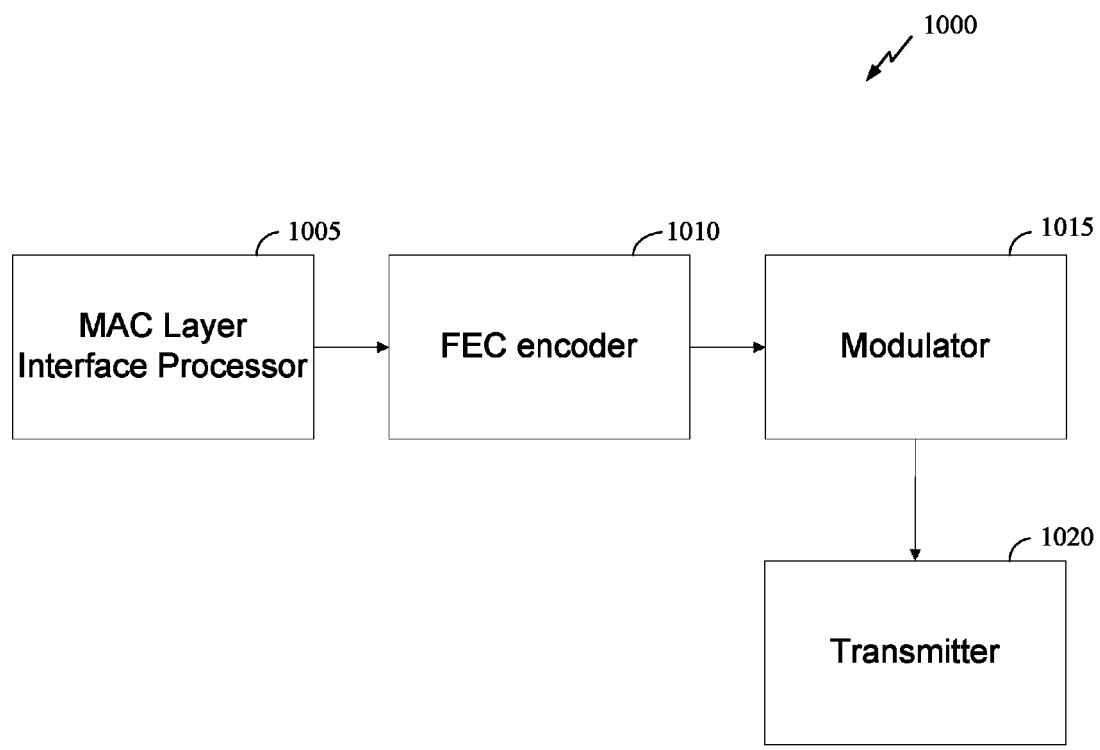
FIG. 10 is a block diagram illustrating a communication device that transmits interleaved data.

As discussed above, the interleaver techniques described herein may be implemented in and utilized as part of a communication system that utilizes interleaving for communicating data between devices. FIG. 10, described below, is an example of such a communication device that can be used in such a communication system.

The interleaver index generator of FIG. 4 may be initially designed by selecting a number generator and seed value. The outputs of the number generator are then run through the scale factor and list processing described above. Outputs of the number generator that produce final index values satisfying a selected S-random constraint have their memory bit assigned to 1, outputs that do not have their memory bit assigned to zero, and the scale factor and list processor are reset to their previous states. If a particular initial selection of number generator and seed produces too many discarded outputs, a new seed or number generator algorithm is tried. This is repeated until a number generation algorithm and seed value that produce a good set of indexes with a relatively small number of required memory bits are identified. Generally, shorter block sizes require a higher proportion of discarded values, often up to four or five discarded outputs for every used output. For block sizes of multiple kbits, about half the outputs may be discarded outputs. During on the fly encoding/decoding as shown in FIG. 4, the same number generator, seed(s), and associated data bits are used that were found to produce a good set of interleaver indexes with reasonable memory requirement during this initial design process. Thus, the previously generated S-random indexes are produced on the fly by the system, rather than storing them all in a much larger memory.

For communication systems that require multiple interleavers, it may be possible to find a single number generator and seed that produces all of the interleaver indexes for all the interleavers, where each different set of indexes for each different interleaver is produced by utilizing different ones of the number generator outputs as defined by the memory bits. Alternatively, different number generators/seeds could be provided for generating at least some different sets of interleaver indexes.

FIG. 10 is a block diagram illustrating a communication device 1000 that transmits interleaved data. The communication device 1000 includes a media access control (MAC) layer interface processor 1005 coupled to a forward error correction (FEC) encoder 1010. The MAC layer interface processor 1005 is configured to receive data to be transmitted, process the data, and send the processed data to the FEC encoder 1010. The FEC encoder 1010 encodes the processed data, which includes interleaving the data. The FEC encoder 1010 includes an interleaver including an interleaver sequence generator (e.g., the interleaver sequence generator 200 or the interleaver sequence generator 400 described above) to interleave the data. The communication device 1000 further includes a modulator 1015 coupled to the FEC encoder 1010. The modulator 1015 modulates the encoded data. The communication device 1000 further includes a transmitter 1020 coupled to the modulator 1015. The transmitter 1020 transmits the modulated data to another device. The transmitter 1020 may further include a digital to analog (D/A) converter that converts the modulated data to analog signals that are transmitted.

The modulator 1015 may be configured to modulate the data using a number of different modulation schemes, such as phase shift keying (PSK) with different numbers of phases, different coding rates, different numbers of bits per symbol, and different code block sizes.

Figure 11:
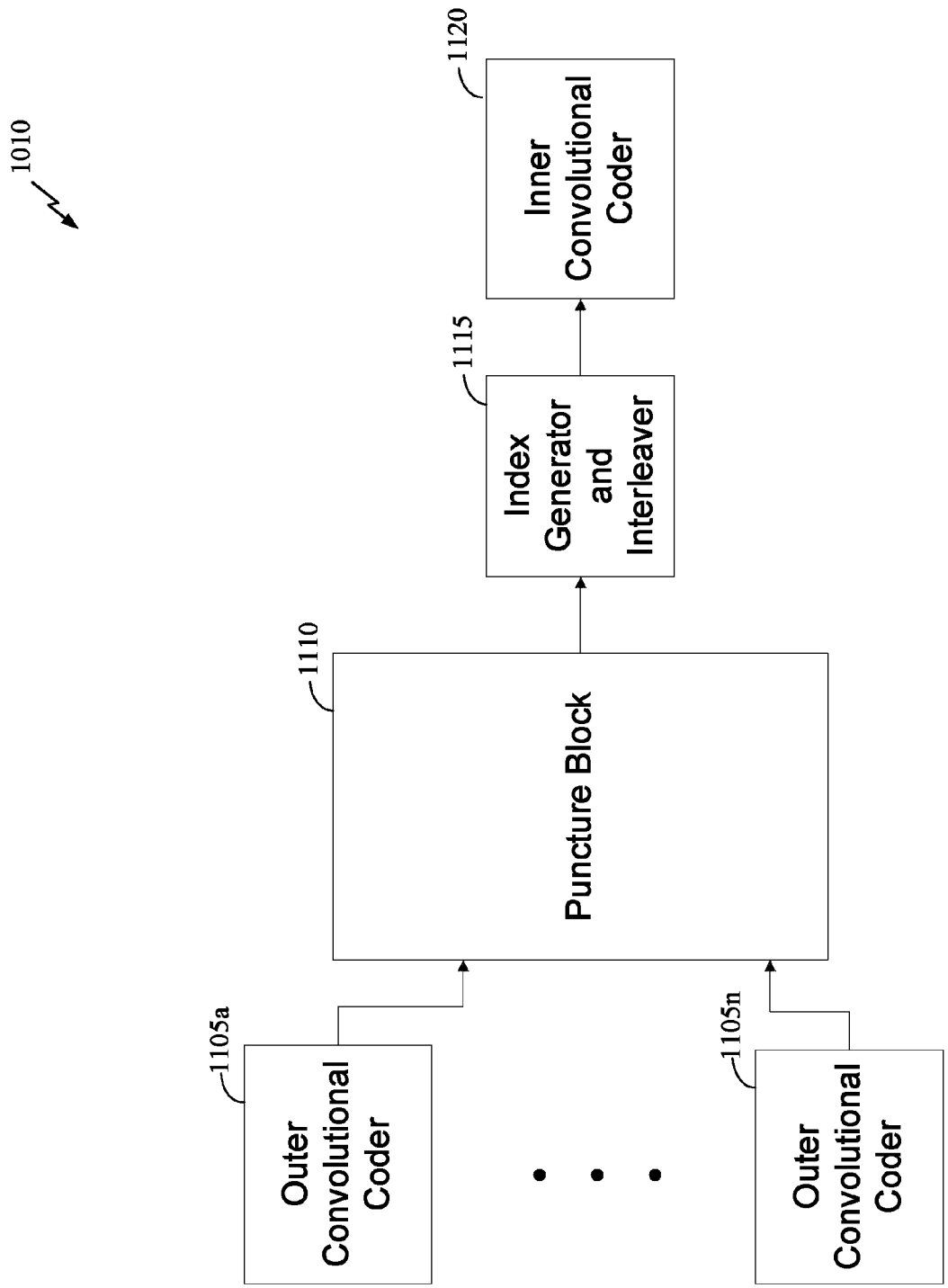
FIG. 11 is a block diagram illustrating one implementation of a forward error correction (FEC) encoder of FIG. 10.

FIG. 11 is a block diagram illustrating one implementation of a forward error correction (FEC) encoder of FIG. 10. As shown, the FEC encoder 1010 is a serial concatenated convolutional code (SCCC) encoder. The FEC encoder 1010 includes a plurality of outer convolutional coders 1105a-1105n, where n is a positive integer. Each outer convolutional coder 1105a-1105n receives the processed data from the MAC layer interface processor 1005 and codes the data in parallel with the remaining outer convolutional coders 1105a-1105n. The FEC encoder 1010 further includes a puncture block 1110 coupled to each of the outer convolutional coders 1105a-1105n. The puncture block 1110 punctures or selects the outputs from the outer convolutional coders 1105a-1105n to produce a single coded output. The coded output is converted to serial data that is forwarded to the index generator and interleaver 1115, which may utilize the interleaver sequence generator 200 or 400 to generate interleaver sequence indexes. The index generator and interleaver 1115 interleaves the coded data. The index generator and interleaver 1115 is further coupled to an inner convolutional coder 1120, which further codes the interleaved data. The inner convolutional coder 1120 sends the encoded data to the modulator 1015 for modulation.

In one or more exemplary embodiments, the functions described may be implemented in hardware, software, firmware, or any combination thereof. The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. If implemented in software, the functions may be stored on or transmitted over as one or more instructions or code on a computer-readable medium. As used herein, instructions refer to computer-implemented steps for processing information in the system. Instructions can be implemented in software, firmware or hardware and include any type of programmed step undertaken by components of the system. Computer-readable media includes both computer storage media and communication media including any medium that facilitates transfer of a computer program from one place to another. A storage media may be any available media that can be accessed by a processor. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. Combinations of the above should also be included within the scope of computer-readable media.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While the above description has pointed out novel features of the technology as applied to various embodiments, the skilled person will understand that various omissions, substitutions, and changes in the form and details of the device or process illustrated may be made without departing from the scope of the instant technology. Therefore, the scope of the technology is defined by the appended claims rather than by the foregoing description. All variations coming within the meaning and range of equivalency of the claims are embraced within their scope.

What is claimed is:

1. An interleaver index generator comprising:
a number generator having an output comprising a series of numerical values;
a memory storing data defining a set of said series of numerical values to use in generating interleaver indexes;
processor circuitry receiving said set of numerical values and processing each of said set of numerical values to generate a corresponding set of interleaver indexes, said processing circuitry implementing a list processor that generates an updated list of unused interleaver indexes as said set of interleaver indexes are generated by the processing circuitry.

2. The interleaver index generator of claim 1, wherein the number generator is a pseudo-random number generator.

3. The interleaver index generator of claim 1, comprising a scale factor processor that scales at least some of the series of numerical values.

4. The interleaver index generator of claim 1, wherein the processor circuitry is configured to generate said set of interleaver indexes by selecting from said list of unused interleaver indexes using said set of numerical values.

5. The interleaver index generator of claim 1, comprising a selector configured to select said set of said series of numerical values to generate the corresponding set of interleaver indexes based at least in part on the stored data.

6. The interleaver index generator of claim 1, wherein the data comprises a series of bits, each bit corresponding to each of said series of numerical values.

7. The interleaver index generator of claim 6, wherein each bit indicates whether the corresponding numerical value of the series of numerical values is part of said subset of numerical values.

8. A method of generating interleaver indexes on the fly during data encoding/decoding comprising:
during encoding or decoding:
generating a series of numerical values;
selecting a subset of said numerical values;
deriving a series of interleaver indexes from said selected subset of numerical values; and
generating an updated list of unused interleaver indexes as said series of interleaver indexes are derived.

9. The method of claim 8, wherein the series of numerical values comprises a series of pseudo-random numbers.

10. The method of claim 8, comprising scaling at least some of the series of numerical values.

11. The method of claim 8, wherein deriving the series of interleaver indexes comprises selecting from said list of unused interleaver indexes using said subset of numerical values.

12. The method of claim 8, comprising selecting said subset of said numerical values to derive the series of interleaver indexes based at least in part on stored data.

13. The method of claim 12, wherein the stored data comprises a series of bits, each bit corresponding to each of said series of numerical values.

14. The method of claim 13, wherein each bit indicates whether the corresponding numerical value of the series of numerical values is part of said subset of numerical values.

15. An interleaver index generator comprising:
means for outputting a series of numerical values;
means for storing data defining a set of said series of numerical values to use in generating interleaver indexes;
means for receiving said set of numerical values and processing each one of said set of numerical values to generate a corresponding set of interleaver indexes; and
means for generating an updated list of unused interleaver indexes as said set of interleaver indexes are generated.

16. The interleaver index generator of claim 15, comprising means for selecting from said list of unused interleaver indexes using said set of numerical values.

17. A non-transitory computer-readable medium, comprising instructions that when executed perform a method of generating interleaver indexes on the fly during data encoding/decoding, the method comprising:
during encoding or decoding:
generating a series of numerical values;
selecting a subset of said numerical values;
deriving a series of interleaver indexes from said selected subset of numerical values; and
generating an updated list of unused interleaver indexes as said series of interleaver indexes are derived.

18. The computer-readable medium of claim 17, wherein deriving the series of interleaver indexes comprises selecting from said list of unused interleaver indexes using said subset of numerical values.

* * * * *